United States Patent [19]

Soth

[11] Patent Number: 4,704,790
[45] Date of Patent: Nov. 10, 1987

[54] METHOD AND APPARATUS FOR ATTACHING COMPONENTS TO SUBSTRATES

[75] Inventor: Henry J. Soth, Brackney, Pa.

[73] Assignee: Universal Instruments Corp., Binghamton, N.Y.

[21] Appl. No.: 805,693

[22] Filed: Dec. 6, 1985

[51] Int. Cl.⁴ .................................. H05K 3/30
[52] U.S. Cl. ............................. 29/838; 72/326
[58] Field of Search ........... 29/739, 741, 838, 845, 29/566.3, 566.4; 72/326; 227/77; 140/105

[56] References Cited

U.S. PATENT DOCUMENTS

| | | | |
|---|---|---|---|
| 901,667 | 10/1908 | Wrigley | 72/326 |
| 3,120,773 | 2/1964 | Esser | 7/131 |
| 3,524,240 | 8/1970 | Walker et al. | 29/739 |
| 3,584,495 | 6/1971 | Rausina | 72/333 |
| 3,751,960 | 8/1973 | Morton et al. | 72/326 |
| 4,040,177 | 8/1977 | Beeler et al. | 72/326 |
| 4,153,082 | 5/1979 | Foley | 29/741 |
| 4,238,948 | 12/1980 | Rose | 29/739 |

Primary Examiner—Lowell A. Larson
Attorney, Agent, or Firm—Fidelman & Wolffe

[57] ABSTRACT

A component lead tip protruding from a hole of a circuit board is split and displaced in order to attach the component to the circuit board. Trimming of the lead to a preferred length generally simultaneously with the splitting is also possible.

9 Claims, 10 Drawing Figures

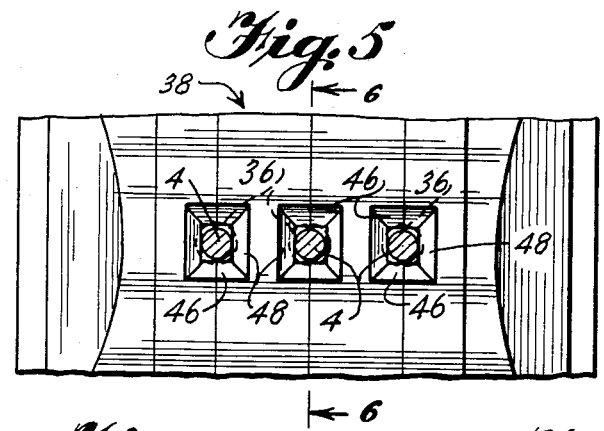
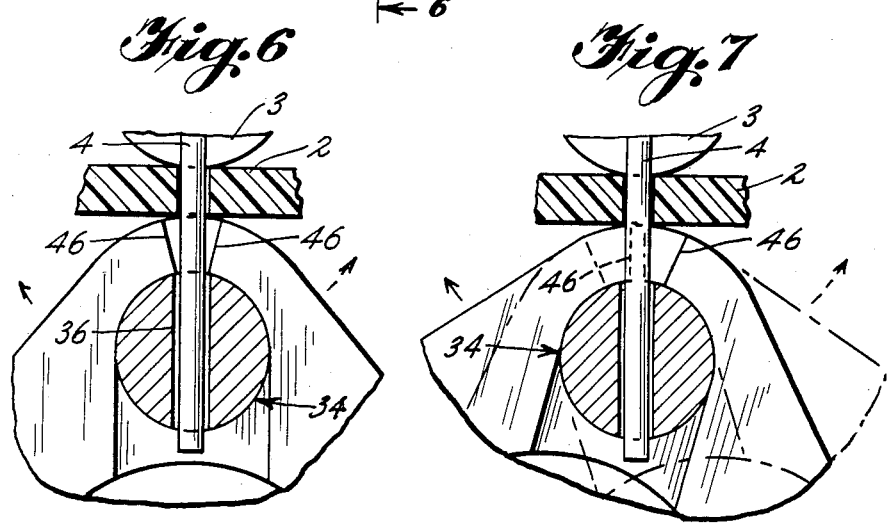
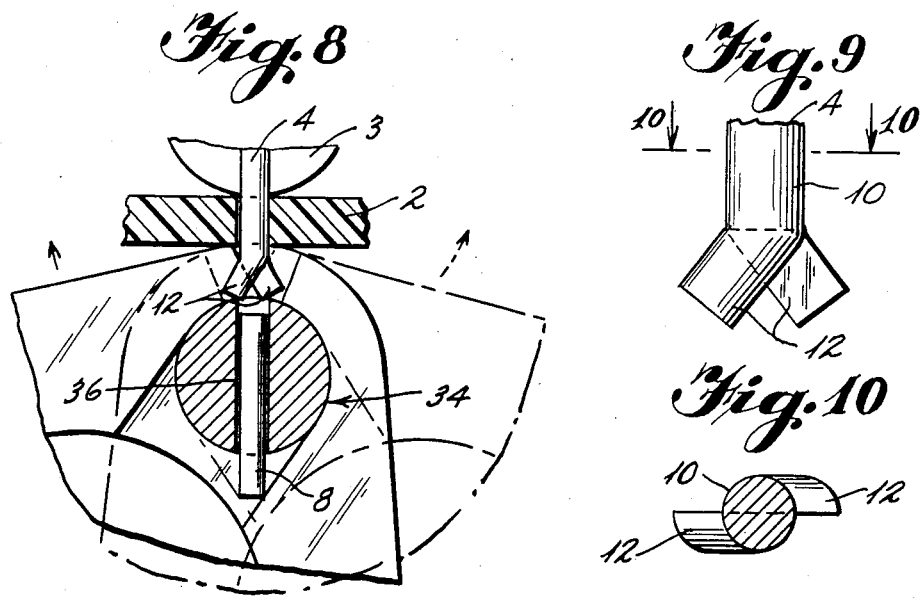

METHOD AND APPARATUS FOR ATTACHING COMPONENTS TO SUBSTRATES

PRIOR ART CROSS-REFERENCES

Japanese Patent Application No. 58-235375- ELECTRONIC PARTS MOUNTING METHOD - Chikahisa, et al., filed Dec. 13, 1983 and Laid Open July 6, 1985.

U.S. Pat. No. 3,429,170 - COMPONENT INSERTERS - Romeo, issued Feb. 25, 1969.

U.S. Pat. No. 4,288,914 - ADJUSTABLE MECHANISM FOR CUTTING AND CLINCHING ELECTRICAL COMPONENT LEADS - Vancelette, issued Sept. 15, 1981.

BACKGROUND AND SUMMARY OF THE INVENTION

The field of the invention deals with the attachment of components to a substrate by deformation of a lead protruding through a hole and from the side of the substrate opposite from the side on which the component is located. More particularly, the invention is directed to mounting of electrical components on circuit boards by deforming a lead portion of the component which protrudes from an underside of the circuit board.

Generally, electrical components are attached to a circuit board by inserting at least one lead thereof through a hole of the circuit board until the body of the component engages a top surface of the circuit board and trimming the lead tip to a preferred length and clinching or bending the lead away from the longitudinal axis thereof. Upon populating a circuit board with a particular number of electrical components in this manner, a more permanent attachment is provided by applying solder to the leads, as by a wave soldering process or the like.

As the density with which components are mounted upon a circuit board increases, the space available for inward or outward clinching of the leads decreases, especially when one considers the sizes and configurations of the tooling used to accomplish this clinching, as exemplified in the U.S. Patents cross-referenced above.

The above cross-referenced Japanese Application is exemplary of a prior art attempt at attaching a component to a circuit board by swaging the lead and providing burrs or portions extending beyond the diameter of the hole in order to retain the component on the board. The Applicant of the instant invention made several attempts at similar approaches and noted deficiencies therein. For instance, the standard paractice is for the diamter of the circuit board hole to be at least 0.015 inches greater than that of the corrsponding lead in order to provide for proper and reliable automated insertion of the lead into the hole. A 0.020 inch lead was inserted in a 0.035 inch hole, and the protruding tip of the lead was totally mashed or coined down to 0.005 inches thickness and there was still not enough lateral spreading of the material of the lead to provide for an attachment similar to that of the Japanese application. In other words, the diameters of the leads and holes would have to be much closer in size than those generally used in the industry at this time, resulting in much closer tolerances for insertion of the leads into the holes.

Still further, swage tooling changes would have to be made more frequently according to changes in the lead and hole diameters, or accomodation would have to be made in the swage tooling to provide a lead-in surface at the top thereof to be able to accomodate the leads of different diameters. However, by providing such a lead-in, the component is movable parallel to the longitudinal axis of the lead, according to the depth of the lead-in surface, after swaging and prior to soldering.

Accordingly, it is an object of the invention to provide a reliable means for attaching a component to a circuit board by deforming at least one lead thereof and wherein the spacing between hole centers on the board may be as close as 0.100 inches. Still further, it is an object of the invention to provide such a device wherein the trimmed and deformed lead generally does not extend out of the area of plating of the hole, in order that less solder may be used in attaching the component more permanently to the circuit board and in order that the components may be mounted on the circuit board with a higher density and less chance of bridging between solder points.

Still further, it is an object of the instant invention to reduce the solder point protruding from the circuit boards such that closer back-to-back spacing of circuit boards may be accomodated.

It is another object of the instant invention to provide a tooling for trimming and deforming a lead tip in order to attach a component to a circuit board whereby the footprint presented by the tooling is such as to eliminate interference with an already-mounted lead in an adjacent hole.

Accordingly, the instant invention comprises an arrangement, for each lead to be trimmed and deformed, of a fixed tool and a cooperating pivotal tool whereby the lead tip protruding from the underside of the circuit board is trimmed to a preferred length and split generally longitudinally thereof into at least two furcations which are displaced laterally of a longitudinal axis of the lead in order to hold the component on a circuit board. Preferably, the lead has been inserted sufficiently into the circuit board for the component to abut against an upper surface of the circuit board so that the lead deformation on the underside of the circuit board will hold the component body against the upper surface of the circuit board while stabilizing the component thereon. When used on a radial lead or axial lead component having two leads, the method and apparatus of the instant invention may be utilized to provide that such a component will be stabilized and not rock about as may occur in some instances with the standard inward or outward clinch.

BRIEF DESCRIPTION OF THE DRAWINGS

FIG. 5 is an enlarged fragmentary top plan view of the inventive device.

FIGS. 6–8 are enlarged fragmentary views, similar to the cross-section of FIG. 2, for illustrating sequential trimming and splitting of a component lead.

FIG. 9 is an enlarged fragmentary view of the tip of a split lead.

FIG. 10 is a cross-section viewed in the direction of arrows 10—10 of FIG. 9

DETAILED DESCRIPTION OF THE INVENTION

Figure 1:
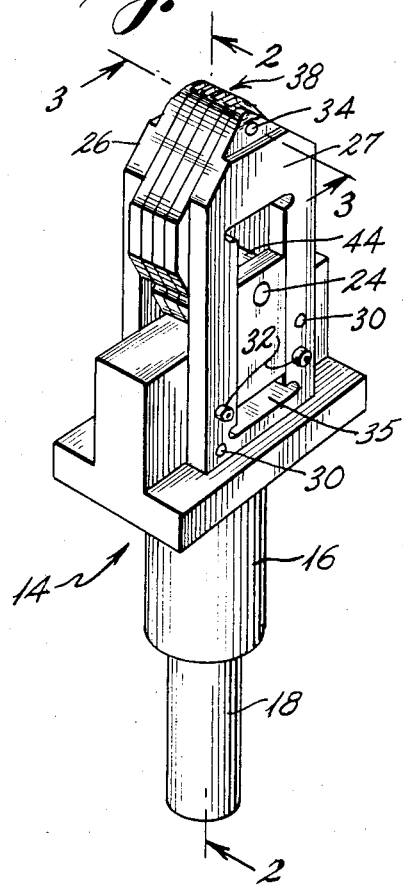
FIG. 1 is an isometric view of the inventive device.

Referring to FIGS. 1-4, the preferred embodiment of the device trims the lead tips to a preferred length in addition to bifurcating the tip and displacing the furcations for attachment of the component to the board.

The novel apparatus comprises a main body 16 having a bore within which an actuator rod 18 is reciprocatable by any well known driver. Left and right retainer plates 26 and 27 are held in proper alignment by pins 30 passing through both plates and a corresponding hole 31 in body 16, and machine screws 32 thread into corresponding holes 33 of main body 16 to securely fasten retainer plates 26 and 27 to body 16.

Retainer plates 26 and 27, in turn, support fixed tool 34 having lead receiving holes 36 therein, with fixed tool 34 receivable in pivotal support holes 40 of pivotal tools 38 so as to provide pivotal support for tooling 38.

Figure 2:
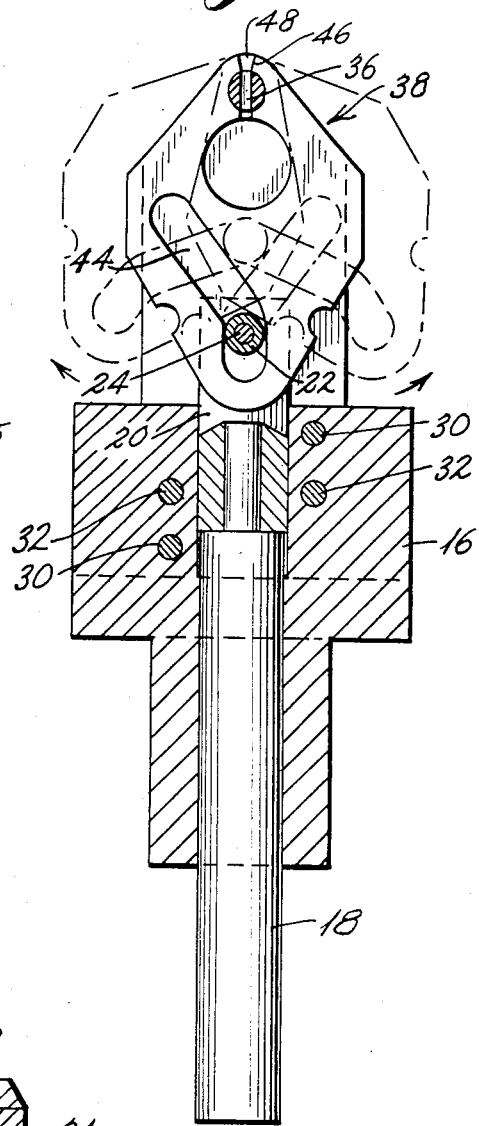
FIG. 2 is a cross-section, as generally viewed in the direction of arrows 2—2 of FIG. 1, with fully actuated position of the splitting tooling illustrated in phantom.

Each of the pivotal tools 38 have a corresponding camming slot 44, and actuator rod 18 has an upper forked end 20 for supporting a bearing sleeve 22 by means of pin 24. Bearing sleeve 22 rides in each of the camming slots 44 such that reciprocation of actuator rod 18 along the longitudinal axis thereof will cause pivoting of tools 38 as indicated in FIG. 2.

Each of the pivotal tools 38 have a vacuum orifice 42 which, in the unactuated position, is in alignment with a vacuum orifice 28 in left retaining plate 26, in order to remove scrap tips from the working area by vacuum upon trimming of the leads.

Figure 3:
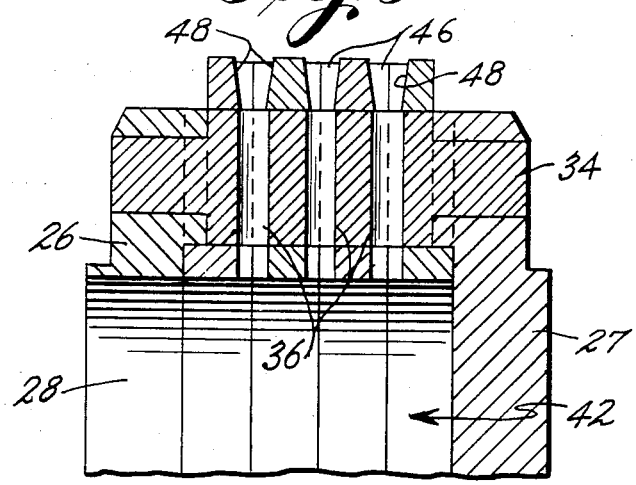
FIG. 3 is a cross-section, as generally viewed in the direction of arrows 3—3 of FIG. 1.
Figure 4:
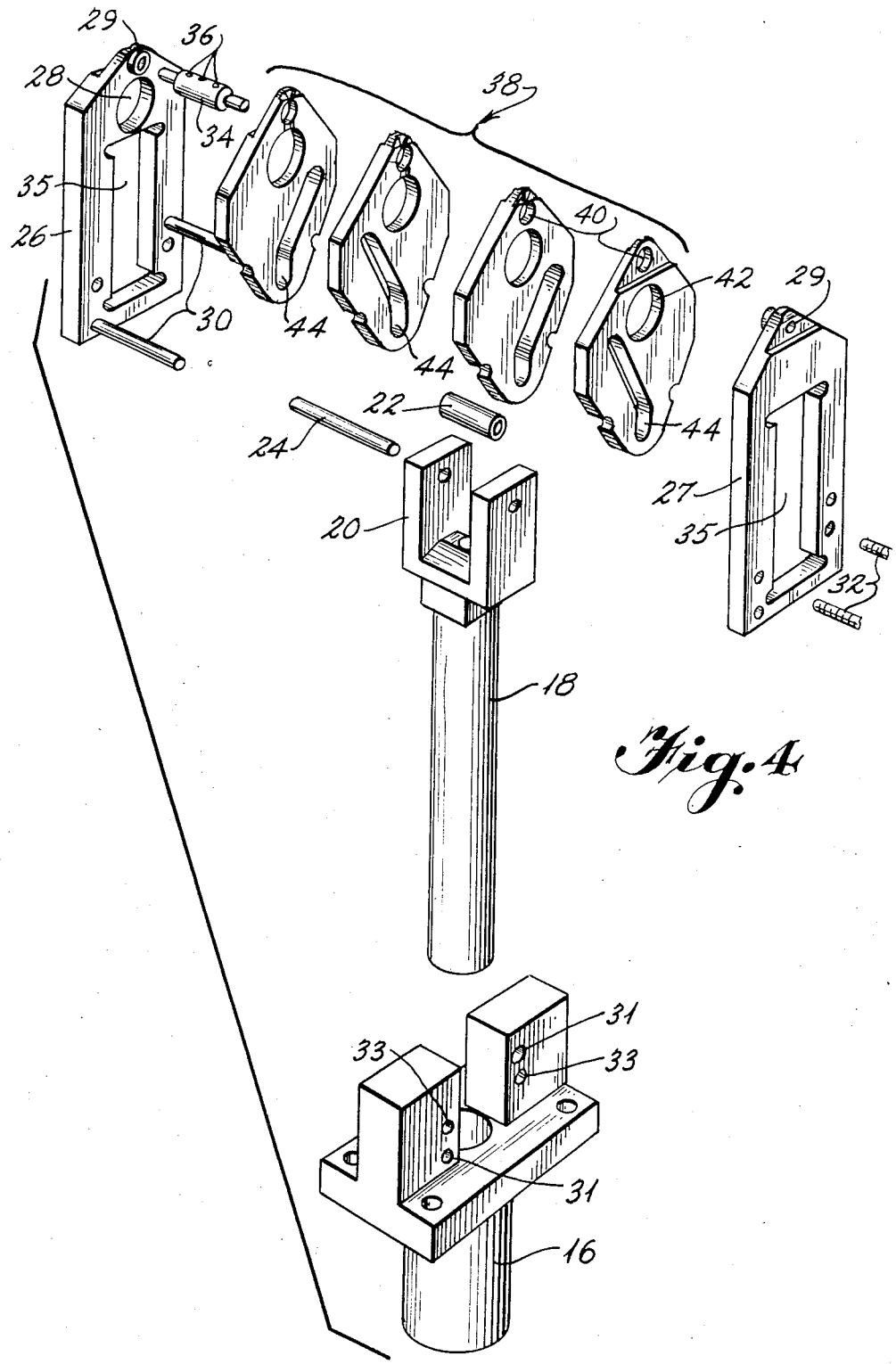
FIG. 4 is an exploded view of the device of FIG. 1.

As seen in FIGS. 3 and 5, adjacent pivotal tools 38 cooperate to define a lead-in for each corresponding hole 36 in the fixed tool 34. Such a lead-in is illustrated as sloping surfaces 46 and 48 which act to guide a lead 4 into a corresponding hole 36 of tool 34. With a lead 4 of component 3 received within the tooling as illustrated in FIG. 6, adjacent pivotal tools 38 are pivoted in opposite directions around fixed tool 34. Thus, as seen in FIGS. 6-10, each lead is trimmed to a preferred length by the shearing action accomplished by pivotal tooling 38 cooperating with fixed tooling 34, and the remaining tip of the lead is bifurcated and displaced laterally of an axis of the lead through the shearing action provided by adjacent, cooperating pivotal tools 38. According to the sizes of the leads being handled, and the sizes and configurations of the pivotal tools 38 and fixed tool 34, lead trimming may occur prior to, after, or generally simultaneously with lead splitting. As stated earlier, the removed scrap portion 8 of the lead, as seen in FIG. 8, will drop through the hole 36 of fixed tooling 34 and be evacuated by vacuum applied through holes 42 of the pivotal tooling and cooperating hole 28 of the left retainer plate 26.

As may be seen from the drawings, plates 26 and 27 are provided with slots 35 in order that forked portion 20 of actuator rod 18 may reciprocate therein.

Although sophisticated, the structure of the device is generally simple to duplicate and, since reciprocation of actuator rod 18 is all that is needed to provide operation thereof, such devices are easily interchangeable in order that a particular work station may handle a wide range of sizes of leads.

Several modifications are considered well within the purview of the instant invention. For instance, the lead-in defined by two adjacent pivotal tools 38 could be cone-shaped. Further, it is conceivable that only one of the furcations 12 would be displaced away from the longitudinal axis of the lead. Still further, it is considered within the purview of the invention that at least one of the furcations 12 may be displaced in the direction lateral to the displacement illustrated in FIGS. 9 and 10. It is also contemplated that the lead may be split longitudinally in a different proportion than the generally illustrated fifty-fifty ratio.

It will thus be seen that the objects set forth above, among those made apparent from the preceding description, are efficiently attained, and, since certain changes may be made in carrying out the above method and in the construction set forth without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

I claim:

1. In a method of attaching a component to a substrate by deforming at least one lead protruding from a bottomside of said substrate, said lead extending from a topside and through a hole of said substrate to said bottomside, the improvement comprising the steps of:
    splitting at least a portion of said protruding lead generally longitudinally to provide furcations; and
    displacing at least one of said furcations laterally of a longitudinal axis of said protruding lead in order to effect said attaching.

2. An improvement as in claim 1, and further comprising the step of:
    trimming said protruding lead to a preferred length.

3. An improvement as in claim 2, and further comprising the step of:
    performing said trimming prior to said splitting.

4. An improvement as in claim 2, and further comprising the step of:
    performing said trimming after said splitting.

5. An improvement as in claim 2, and further comprising the step of:
    performing said trimming generally simultaneously with said splitting.

6. In an apparatus for attaching a component to a substrate by deforming at least one lead protruding from a bottom side of said substrate, said lead extending from a topside and through a hole of said substrate to said bottomside, the improvement comprising:
    means for splitting at least a portion of said protruding lead generally longitudinally to provide furcations;
    means for displacing at least one of said furcations laterally of a longitudinal axis of said protruding lead in oder to effect said attaching;
    means for trimming said protruding lead to a preferred length; and
    means for performing said trimming generally simultaneously with said splitting.

7. In an apparatus for attaching a component to a substrate by deforming at least one lead protruding from a bottomside of said substrate, said lead extending from a topside and through a hole of said substrate to said bottomside, the improvement comprising:
    means for splitting at least a portion of said protruding lead generally longitudinally to provide furcations;

means for displacing at least one of said furcations laterally of a longitudinal axis of said protruding lead in order to effect said attaching;

means for trimming said protruding lead to a preferred length, said trimming means comprising a die means for cooperating with said splitting means in order to perform said trimming.

8. In an apparatus for attaching a component to a substrate by deforming at least one lead protruding from a bottomside of said substrate, said lead extending from a topside and through a hole of said substrate to said bottomside, the improvement comprising:

means for splitting at least a portion of said protruding lead generally longitudinally to provide furcations and comprising at least two tools having means for receiving said protruding lead therebetween, said tools being moveable relative to each other and cooperative in a shearing action to effect said splitting;

means for moving said tools relative to each other for said shearing action;

means for displacing at least one of said furcations laterally of a longitudinal axis of said protruding lead in order to effect said attaching; and means for trimming said protruding lead to a preferred length, said trimming means comprising a die means for cooperating with said splitting means in order to perform said trimming.

9. An improvement as in claim 8, and further comprising:

said die means having an outer surface with an orifice therein for receiving a portion to be trimmed from said protruding lead; and said tools being relatively slideable across said outer surface at said orifice in order to effect said trimming.

* * * * *